United States Patent [19]
Ogasawara et al.

[11] Patent Number: 5,121,183
[45] Date of Patent: Jun. 9, 1992

[54] LIGHT RESPONSIVE HETEROJUNCTION SEMICONDUCTOR PN ELEMENT

[75] Inventors: Nobuyoshi Ogasawara; Kotaro Mitsui, both of Itami, Japan

[73] Assignee: Mitsubishi Denki Kabushiki Kaisha, Tokyo, Japan

[21] Appl. No.: 279,082

[22] Filed: Dec. 2, 1988

[30] Foreign Application Priority Data

Jun. 1, 1988 [JP] Japan .................. 63-136501

[51] Int. Cl.⁵ .............................................. H01L 27/14
[52] U.S. Cl. .................................. 357/30; 357/16; 357/4; 136/255; 136/262; 136/249
[58] Field of Search ............. 357/4, 16, 30 J, 30 E, 357/30 P; 136/255, 262, 249

[56] References Cited

U.S. PATENT DOCUMENTS

| | | | |
|---|---|---|---|
| 4,427,841 | 1/1984 | Rahilly | 357/30 X |
| 4,547,622 | 10/1985 | Fan et al. | 357/16 X |

FOREIGN PATENT DOCUMENTS

| | | |
|---|---|---|
| 0010828 | 5/1980 | European Pat. Off. |
| 3732619 | 3/1988 | Fed. Rep. of Germany |
| 60-218880 | 11/1985 | Japan |
| 60-218881 | 11/1985 | Japan |
| 61-229371 | 10/1986 | Japan |
| 61-237477 | 10/1986 | Japan |
| 2116775 | 3/1983 | United Kingdom |

OTHER PUBLICATIONS

Pearah et al., "Optical Reflectance in GaAs/AlGaAs Quantum Wells," *J. Appl. Phys.* 59(11), Jun. 1, 1986, pp. 3847–3850.

Itoh et al., "14.5% Conversion Efficiency GaAs Solar Cell Fabricated on Si Substrates," *Appl. Phys. Lett.* 49(23); Dec. 8, 1986, pp. 1614–1616.

van der Zeil et al., "Optical Second Harmonic . . . Structures", Applied Physics Letters, vol. 28, No. 9, Apr. 15, 1976.

Laidig et al., "Reflectance of AlAs-GaAs . . . Superlattices", Journal of Applied Physics, 56(6) Sep. 15, 1984.

*Primary Examiner*—William Mintel
*Attorney, Agent, or Firm*—Leydig, Voit & Mayer

[57] ABSTRACT

A light responsive semiconductor includes a second conductivity type semiconductor substrate, a photoelectric conversion layer comprising semiconductor layers having a pn junction, which is disposed on the second conductivity type semiconductor substrate, a buffer layer comprising a second conductivity type semiconductor layer having a larger energy band gap than that of the photoelectric conversion layer. The element further includes a light reflection layer comprising a semiconductor layer which is disposed between the second conductivity type semiconductor substrate and the buffer layer. Alternatively, a light reflection layer which is a buffer layer is disposed between a photoelectric conversion layer and a semiconductor substrate.

19 Claims, 6 Drawing Sheets

LIGHT RESPONSIVE HETEROJUNCTION SEMICONDUCTOR PN ELEMENT

FIELD OF THE INVENTION

The present invention relates to a liquid responsive semiconductor element and more particularly to an improvement in the structure thereof.

BACKGROUND OF THE INVENTION

FIG. 9 is a cross-sectional view of a GaAs solar cell as an example of a prior art light responsive semiconductor element. In FIG. 9, reference numeral 1 designates an n type GaAs substrate (hereinafter referred to as n type substrate). An n type AlGaAs buffer layer (hereinafter referred to as buffer type) 2 is disposed on the n type substrate 1 by a metal organic chemical vapor deposition method (MOCVD method) or a molecular beam epitaxy method (MBE method). An n type GaAs layer 3 (hereinafter referred to as n type layer) is disposed on the buffer layer 2. A p type GaAs layer (hereinafter referred to as p type layer) 4 is disposed on the n type layer 3. A p type AlGaAs layer (hereinafter referred to as window layer) 5 is disposed on the p type layer 4. Anti-reflection films (hereinafter referred to as AR film) 6a and 6b comprising $Si_3N_4$ or $Ta_2O_5$ produced by a chemical vapor deposition method (CVD method) or a sputtering method are disposed on the window layer 5. A p side electrode 7 is disposed on the p type layer 4 through a contact hole which is opened in the AR film 6 and the window layer 5 by etching. Electrode 7 is deposited by an evaporation method or a sputtering method. An n side electrode 8 is disposed on the rear surface of the n type substrate 1.

The operation will be described.

Light which is incident on a solar cell generates charge carriers in the window layer 5, the p type layer 4, and the n type layer 3. Among these charge carriers, only the charge carriers which diffuse and reach the pn junction between the p type layer 4 and the n type layer 3, contribute to the photocurrent. Generally, the light absorption coefficient of a crystal has a wavelength dependency in which the shorter the wavelength, the higher the light absorption coefficient. Accordingly, charge carriers are likely to be generated at the shallow region near the surface. The pn junction of the solar cell is located in the effective light absorption path where most of the charge carriers are generated. Furthermore, the buffer layer 2 prevents the generated change carriers from diffusing toward the n type substrate 1 due to the potential barrier presented. Buffer layer 2 also functions as a BSF (Back Surface Field) which reflects the charge carriers which have reached the buffer layer toward the pn junction surface. By this BSF effect, the recombination rate of charge carriers (electrons and holes) at the rear surface of the buffer layer 2 is reduced, thereby resulting in a reduction in reverse saturation current and an increase in open-circuit voltage. This buffer layer 2 is located at a position deeper than the depth of effective light absorption. The distance from this buffer layer 2 to the pn junction is established within a diffusion length of the charge carriers to enhance the effect of BSF.

In the prior art charge generation element so constructed, when the diffusion length of light carriers is reduced by a crystal defect produced by irradiation, even if the charge diffusing toward the n type substrate 1 are reflected the BSF effect of the buffer layer 2, they cannot reach the pn junction surface. In such a case, the BSF effect of the buffer layer 2 cannot be utilized effectively, thereby resulting in a reduction of the radiation resistance of the solar cell.

On the other hand, when the buffer layer 2 is in a shallow position to obtain sufficient BSF effect to enhance radiation resistance regardless of a little reduction in of the diffusion length, the effective light absorption depth is decreased, and therefore sufficient light absorption is not obtained, resulting in a reduced photocurrent. This also results in a reduced initial efficiency.

SUMMARY OF THE INVENTION

It is an object of the present invention to provide a light generation element having a high initial efficiency and superior radiation resistance.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a light reflection layer is disposed between a buffer layer a semiconductor substrate, or a light reflection layer which functions as a buffer layer is disposed between a photoelectric conversion layer and a semiconductor substrate. Accordingly, even if the diffusion length of charge carriers is reduced due to irradiation, the ability to collect charge carriers and the quantity of light absorption at the photoelectric conversion layer are not attenuated. This results in superior radiation resistance and superior initial efficiency.

DETAILED DESCRIPTION OF THE PREFERRED EMBODIMENTS

An embodiment of the present invention will be described with reference to FIG. 1.

Figure 1:
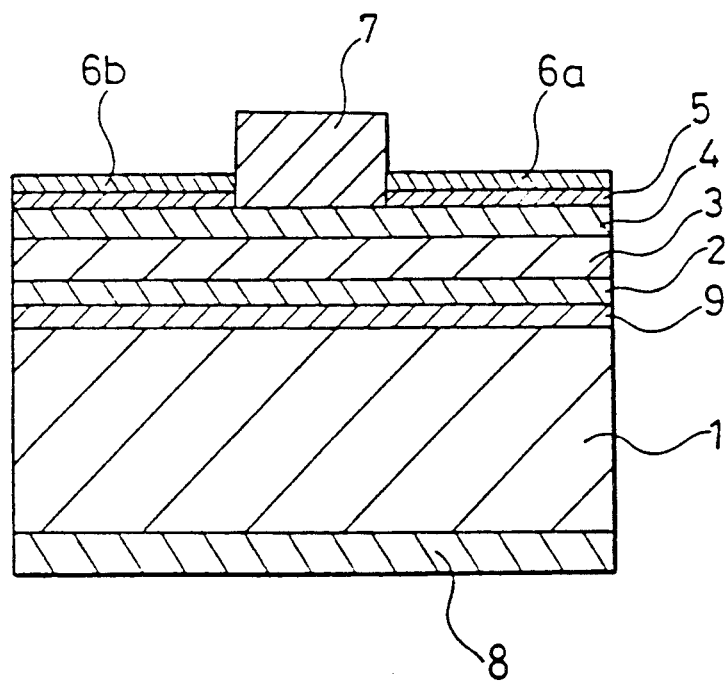
FIG. 1 is a cross-sectional view of a GaAs solar cell as a first embodiment of the present invention.
Figure 9:
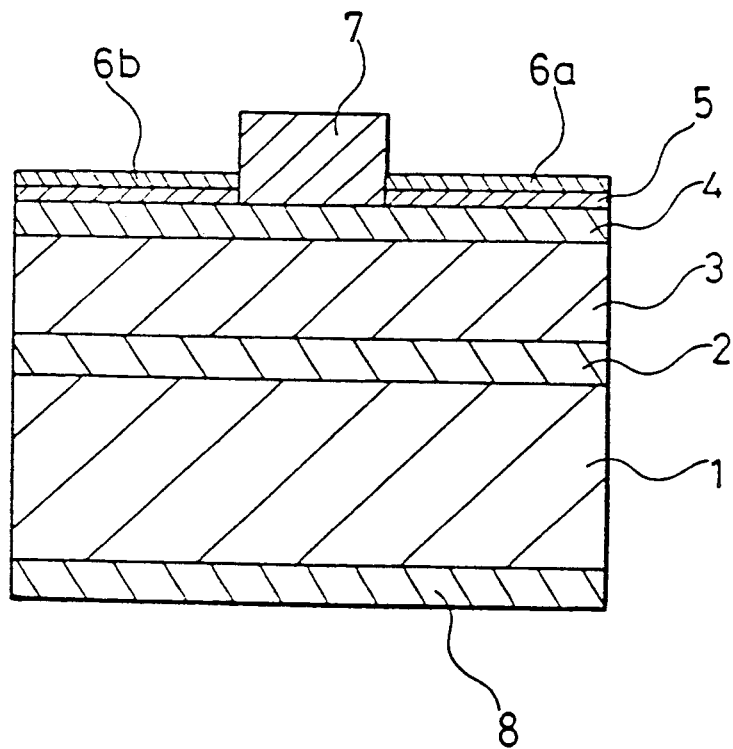
FIG. 9 is a cross-sectional view of a prior art light generation element.

FIG. 1 shows a cross-sectional view of a GaAs solar cell as a first embodiment of the present invention. In FIG. 1, the same reference numerals designate the same elements as those shown in FIG. 9. Reference numeral 9 designates a light reflection layer disposed between the n type substrate 1 and the buffer layer 2.

The production process will be described.

At first, a light reflection layer 9 comprising for example, $Al_xGa_{1-x}As$, $GaAs_yP_{1-y}$, or $In_xGa_{1-x}As$ system, is deposited on the n type GaAs substrate 1 by a metal organic chemical vapor deposition method (MOCVD method), a molecular beam epitaxy method (MBE method), or a vapor phase epitaxy method (VPE method). A buffer layer 2 comprising an n type AlGaAs is deposited on the light reflection layer 9 to a film thickness of about 0.1 $\mu$m by a MOCVD method or a MBE method. Then, an n type GaAs layer 3 having a dopant concentration of about $2 \times 10^{17}$ cm$^{-3}$ is deposited on the buffer layer 2 to a film thickness of about 1.5 to 2.5 $\mu$m.

A type GaAs layer 4 having a dopant concentration of about $5 \times 10^{18}$ cm$^{-3}$ is deposited on the n type layer 3 to a film thickness of about 0.3 to 0.5 $\mu$m. A p type $Al_xGa_{1-x}As$ layer (x=0.85) is deposited on the p type layer 4 to a film thickness of about 500 Å to produce a window 5. An anti-reflection film 6 comprising $Si_3N_4$ or $Ta_2O_5$ having refractive index of 1.9 to 2.0 is deposited on the window layer 5 to a film thickness of 700 to 750 Å by a chemical vapor deposition method (CVD method) or a sputtering method. Next, a contact hole is opened by etching the AR film 6 and the window layer 5. A p side electrode 7 and an n side electrode 8 are deposited on the p type layer 4 and the rear surface of the n type substrate 1, respectively, by such as evaporation or sputtering. Herein, the buffer layer 2 is located at a position near the pn junction in order to keep sufficient BSF effect even when the diffusion length is reduced a little due to irradiation. In this embodiment, the buffer layer 2 is located at about one-half the distance of the effective light absorption depth from the surface of element (about 2 to 3 $\mu$m from the surface). The window layer 5 has to have a film thickness of about 500 Å or less in order to prevent light absorption.

The operation will be described.

Figure 4:
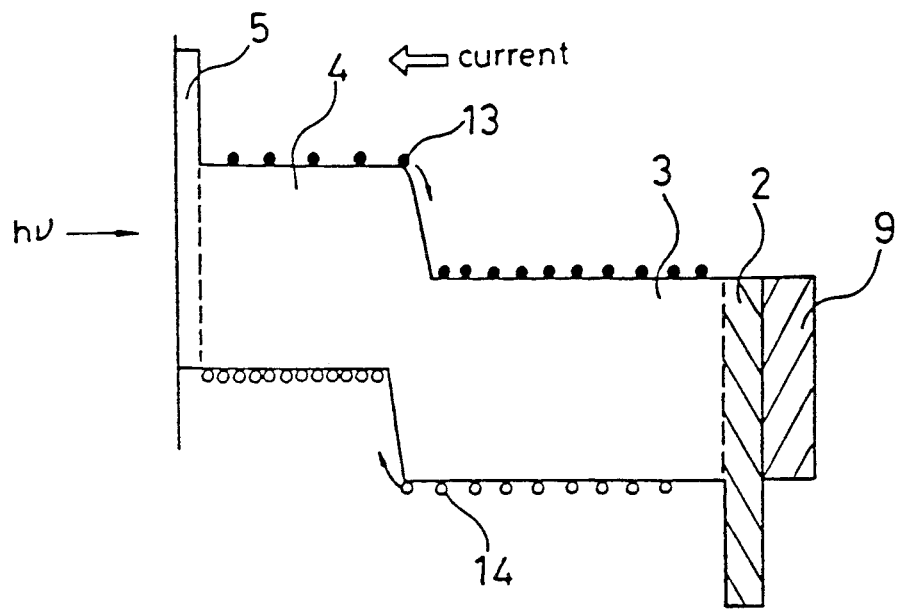
FIG. 4 is an energy band diagram of the cell of FIG. 1.

FIG. 4 is an energy band diagram for explaining operation of a solar cell according to the first embodiment of the present invention. In FIG. 4, the same reference numerals designate the same elements as those shown in FIG. 1. Reference numeral 13 designates electrons and reference numeral 14 designates holes. When light irradiates the element, an absorbed photon generates a pair of electrons 13 and holes 14. Electrons 13 generated in the p type layer 4 move toward the n type layer 3, which is energically stable for electrons, and holes 14 generated in the n type layer 3 move toward the p type layer 4, which is energically stable for holes, by thermal diffusion. Thus, electrons and holes reach the pn junction, thereby generating a current at the depletion layer. In this embodiment, the buffer layer 2 is located at a position half the distance of the effective light absorption depth from the surface of element and the light reflection layer 9 is disposed under the buffer layer 2. Therefore, light having a long wavelength and having a low light absorption coefficient is transmitted to the buffer layer 2 without producing charge carriers in the photoelectric conversion layer which includes the p type layer 4 and the n type layer 3. That long wavelength light is reflected into the photoelectric conversion layer by the light reflection layer 9, and passes through the other half of the effective light absorption path depth to reach the surface of element. Accordingly, incident photons travel a distance equal to the effective light absorption depth after the incidence because they are reflected at the light reflection layer 9 toward the surface of element. This means that almost the same quantity of charge carriers as in the case where the buffer layer 2 is located at a deeper position than the effective light absorption depth may be produced in the photoelectric conversion layer. Besides, the window layer 5 prevents holes and electrons from recombining at the surface of the element.

In such a structure charge carriers produced by light in the long wavelength region at a deep position from the surface of element due to the low light absorption coefficient in the prior art device, can be effectively collected in the photoelectric conversion layer. Furthermore, since the buffer layer 2 which has a BSF effect is located at a position closer to the pn junction surface than the prior art device, charge carriers can efficiently reach the pn junction surface even if the diffusion length of charge carriers is reduced by irradiation.

Next, the production process of the light reflection layer 9 will be described.

As described the light absorption coefficient of crystals has a wavelength dependency and the longer the light wavelength the lower the light absorption coefficient, which means that longer wavelength light is easily transmitted, that is, the light reflection layer 9 preferably effectively reflects the longer wavelength light which has a low absorption coefficient.

The reflectance of thin films will be described in detail.

The reflectance of a thin film is given by the following formulae. Herein, it is supposed that there is no light absorption by the medium or by thin films and that light is incident only vertically, for simplification.

Figure 6:
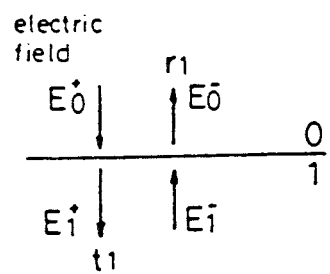
FIG. 6 is a diagram for explaining reflection at an interface surface.
Figure 7:
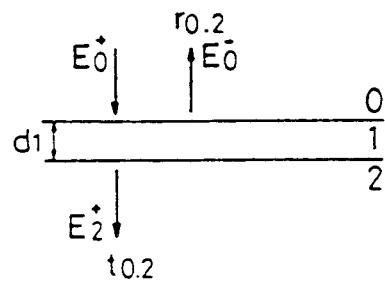
FIG. 7 is a diagram for explaining reflection at a single-layer film.

1) In the case of reflection at an interface ("1"→"0"):

In the diagram in FIG. 6, if it is supposed that that refractive index of the "0" layer is $n_0$ and that of the "1" layer is $n_1$, then Amplitude reflectance; $r_1 = \dfrac{n_0 - n_1}{n_0 + n_1}$ Amplitude transmittance; $t_1 = \sqrt{1 - r_1^2} = \dfrac{2\sqrt{n_0 n_1}}{n_0 + n_1}$ and accordingly, Energy reflectance; $R_1 = r_1^2 = \dfrac{(n_0 - n_1)^2}{(n_0 + n_1)^2}$ Energy transmittance; $T_1 = t_1^2 = \dfrac{4 n_0 n_1}{(n_0 + n_1)^2}$ 2) In the case of reflection by a single-layer film;

In the diagram shown in FIG. 7, if it is supposed that the refractive index of the "0" layer is $n_0$, that of the "1" layer is $n_1$, and that of the "2" layer is $n_2$, i) In the case of the "0" layer reflection at the interface→ "1" layer Amplitude reflectance; $r_1 = \dfrac{n_0 - n_1}{n_0 + n_1}$ -continued Amplitude transmittance: $t_1 = \dfrac{2\sqrt{n_0 n_1}}{n_0 + n_1}$ ii) In the case of reflection at the interface "1" layer→"2" layer Amplitude reflectance: $r_2 = \dfrac{n_1 - n_2}{n_1 + n_2}$ Amplitude transmittance: $t_2 = \dfrac{2\sqrt{n_1 n_2}}{n_1 + n_2}$ Herein, if supposed that electric field vector in the direction from the "0" layer to the "1" layer is $E_0^-$ and that reflected at the "1" layer into the "0" layer is $E_0^-$, $$\begin{pmatrix} E_0^- \\ E_0^- \end{pmatrix} = \dfrac{1}{t_1 \cdot t_2} \begin{pmatrix} 1 & r_1 \\ r_1 & 1 \end{pmatrix} \begin{pmatrix} e^{i\delta_1} & r_2 e^{i\delta_1} \\ r_2 e^{-i\delta_1} & e^{-i\delta_1} \end{pmatrix} \begin{pmatrix} 0 \\ E_2^- \end{pmatrix}$$

herein, $$\delta_1 = \dfrac{2\pi}{\lambda} n_1 d_1$$

$d_1$: single-layer film thickness

This will be a fundamental formula for calculating reflectance by a multi-layer film. From the above formula, Amplitude reflectance: $r_{0,2} = \dfrac{r_2 e^{i\delta_1} + r_1 e^{-i\delta_1}}{r_1 r_2 e^{i\delta_1} + e^{-i\delta_1}}$ Energy reflectance: $R_{0,2} = |r_{0,2}|^2$ $$= \dfrac{(r_1 + r_2)^2 \cos^2\delta_1 + (r_1 - r_2)^2 \sin^2\delta_1}{(1 + r_1 r_2)^2 \cos^2\delta_1 + (1 - r_1 r_2)^2 \sin^2\delta_1}$$

Herein, if it is supposed that single-layer film 1 is produced in a ¼ wavelength thickness, i.e., in which the product $n_1 \cdot d_1$ of refractive index $n_1$ and film thickness $d_1$ is equal to a quarter of wavelength of light which is to be reflected, $$R_{0,2} = \dfrac{(r_1 - r_2)^2}{(1 - r_1 r_2)^2} = \dfrac{(n_1^2 - n_0 n_2)^2}{(n_1^2 + n_0 n_2)^2} \quad (1)$$

Figure 8:
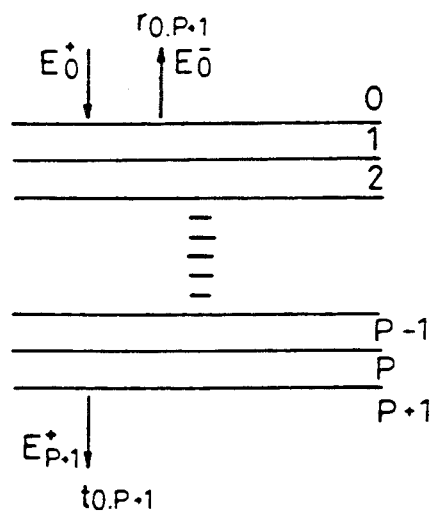
FIG. 8 is a diagram for explaining reflection at a multi-layer film.

3) In the case of reflection by multi-layer film;
In the diagram shown in FIG. 8, "0" layer → "1" layer; $r_1 = \dfrac{n_0 - n_1}{n_0 + n_1}$

.
.
.

"j − 1" layer → "j" layer; $r_j = \dfrac{n_{j-1} - n_j}{n_{j-1} + n_j}$

.
.
.

"p" layer → "p + 1" layer; $r_{p+1} = \dfrac{n_p - n_{p+1}}{n_p + n_{p+1}}$

-continued
and accordingly, $$r_{0,p-1} = \dfrac{r_{p-1} e^{i\delta_p} + r_{0,p} e^{-i\delta_p}}{e^{i\delta_p} + r_{p-1} r_{0,p} e^{-i\delta_p}}$$

In case of p=2 (double-layer film), $$r_{0,3} = \dfrac{r_3 e^{i\delta_2} + r_{0,2} e^{-i\delta_2}}{e^{i\delta_2} + r_3 r_{0,2} e^{-i\delta_2}}$$

If it is supposed that the "1" layer and the "2" layer are produced in ¼ wavelength thicknesses, $$r_{0,3} = \dfrac{r_3 - r_{0,2}}{1 - r_3 r_{0,3}} = \dfrac{n_2 B_1 - A_1 n_3}{n_2 B_1 + A_1 n_3}$$

$$= \dfrac{A_2 - B_2}{A_2 + B_2}$$

herein, $A_1 = n_1^2, A_2 = n_2 B_1 = n_0 n_2^2.$
$B_1 = n_0 n_2, B_2 = A_1 n_3 = n_1^2 n_3$ Accordingly, energy reflectance;

$$R_{0,3} = |r_{0,3}|^2 = \dfrac{(n_0 n_2^2 - n_1^2 n_3)^2}{(n_0 n_2^2 + n_1^2 n_3)^2}$$

and in case of $n_0 = n_3$;

$$R_{0,3} = \dfrac{(n_2^2 - n_1^2)^2}{(n_2^2 + n_1^2)^2} = \dfrac{\{(n_2/n_1)^2 - 1\}^2}{\{(n_2/n_1)^2 + 1\}^2} \quad (2)$$

As described above, when the light reflection film 9 is produced in a ¼ wavelength (λ/4) thickness, i.e., in which the product $n_{RL} \cdot d_{RL}$ of refractive index $n_{RL}$ and film thickness $d_{RL}$ is equal to a quarter of the wavelength of light which is to be reflected, the higher the ratio of (i.e., the difference between) $n_2$ and $n_1$, the closer R approaches 1 as deduced from formula (2). That is, the higher the ratio of (the difference between) refractive index $n_{RL}$ of the light reflection layer and refractive index of the buffer layer 2 is and the higher the ratios of (the differences between) the reflective indices of the n type substrate 1 or the n type layer 3 and the light reflection layer 9, the higher the reflectance, thereby resulting in increased photocurrent.

In the above-illustrated first embodiment, the buffer layer 2 is located at a position of half the effective light absorption depth from the surface of the element, and the light reflection layer 9 is disposed under the buffer layer 2. Therefore, light carriers which cannot reach the pn junction surface because of a reduction in diffusion length due to irradiation, and charge carriers resulting from the long wavelength light which has been transmitted through the buffer layer 2 in the prior art device, are efficiently collected, thereby resulting in a light generation element superior in radiation resistance and initial efficiency.

FIG. 2(a) shows a cross-sectional view of a GaAs solar cell as a second embodiment of the present invention and FIG. 2(b) shows an enlarged view of the portion of the embodiment of FIG. 2(a) enclosed with the broken line of FIG. 2(a). In the figures the same reference numerals designate the same elements as those shown in FIG. 1. A superlattice layer is used for the light reflection layer 9. The superlattice includes first reflection layers 10a to 10d comprising $Al_xGa_{1-x}As$ (x=0.6) of 100 Å film thickness and second reflection layers 11a to 11d comprising GaAs of 100 Å film thickness alternatively laminated on each other about 20 times.

The calculation of the reflectance of the light reflection layer 9 comprising the superlattice layer will be described. It is supposed that the refractive index of the first reflection layers 10a to 10b is $n_A$, that of second reflection layers 11a to 11b $n_B$, and these reflection layers are produced in ¼ wavelength thicknesses ($n_A d_A = n_B d_B = \lambda/4$), respectively that, $$\begin{cases} n_1 = n_3 = \ldots = n_{2p-1} = n_A \\ n_2 = n_4 = \ldots = n_{2p} = n_B \end{cases}$$

$$\begin{cases} r_2 = r_4 = \ldots = r_{2p} \\ r_3 = r_5 = \ldots = r_{2p-1} \end{cases}$$

Then, $$r_{0,2p+1} = \frac{A_{2p} - B_{2p}}{A_{2p} + B_{2p}}$$

herein.

$$\begin{aligned} A_{2p} &= n_{2p} B_{2p-1} \\ &= n_{2p} n_{2p} A_{2p-2} \\ &= n_{2p}^2 n_{2p-2} B_{2p-3} \ldots \\ &= n_{2p}^2 \ldots n_4^2 n_2^2 n_0 \end{aligned}$$

$$\begin{aligned} B_{2p} &= A_{2p-1} n_{2p-1} \\ &= B_{2p-2} n_{2p-1} n_{2p-1} \\ &= A_{2p-3} n_{2p-1}^2 n_{2p-1} \ldots \\ &= n_1^2 n_3^2 \ldots n_{2p-1}^2 n_{2p-1} \end{aligned}$$

Accordingly, $$A_{2p} = n_0 (n_A)^{2p}$$
$$B_{2p} = (n_B)^{2p} n_{2p+1}$$

Amplitude reflectance;

$$r_{0,2p+1} = \frac{A_{2p} - B_{2p}}{A_{2p} + B_{2p}}$$

$$= \frac{n_0 (n_A)^{2p} - (n_B)^{2p} n_{2p+1}}{n_0 (n_A)^{2p} + (n_B)^{2p} n_{2p+1}}$$

Energy reflectance;

$$R_{0,2p+1} = |r_{0,2p+1}|^2$$

Herein, in case of $n_0 = n_{2p+1}$;

$$r_{0,2p+1} = \frac{n_A^{2p} - n_B^{2p}}{N_A^{2p} + n_B^{2p}} = \frac{(n_A/n_B)^{2p} - 1}{(n_A/n_B)^{2p} + 1}$$

and accordingly.

-continued $$R_{0,2p+1} = |r_{0,2p+1}|^2 = \frac{\{(n_A/n_B)^{2p} - 1\}^2}{\{(n_A/n_B)^{2p} + 1\}^2} \quad (3)$$

As is evident from formula (3), in case where the layers of superlattice 9 are produced in ¼ wavelength thicknesses, the higher the ratio of (the difference between) $n_A$ and $n_B$ is and the larger the number of layers (p), the closer the energy reflectance $R_{0,2p+1}$ of the superlattice 9 approaches 1 that is, the higher the ratio of (the difference between) refractive index $n_{RL1}$ of the first reflection layers 10a to 10d and refractive index $n_{RL2}$ of the second reflection layers 11a to 11d, and the higher the ratios of (the differences between) refractive indices of the n type substrate 1 or the n type layer 3, and the light reflection layer 9, and the larger the number of the superlattice layers, the higher the reflection factor thereby resulting in increased photocurrent.

In the above-illustrated second embodiment, in addition to the effects of the first embodiment, reflectance at the light reflection layer 9 is increased, thereby enhancing the collection of charge carriers.

Figure 3:
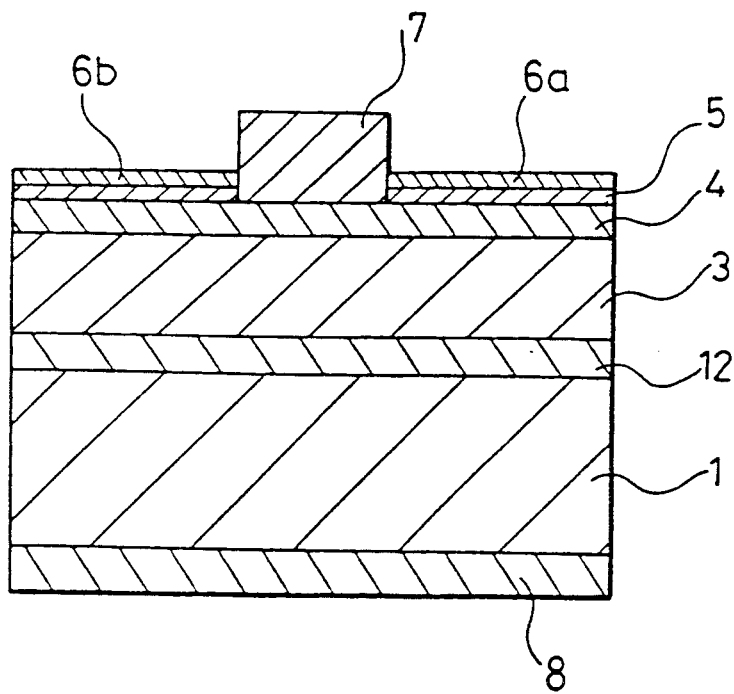
FIG. 3 is a cross-sectional view of a GaAs solar cell as a third embodiment of the present invention.
Figure 5:
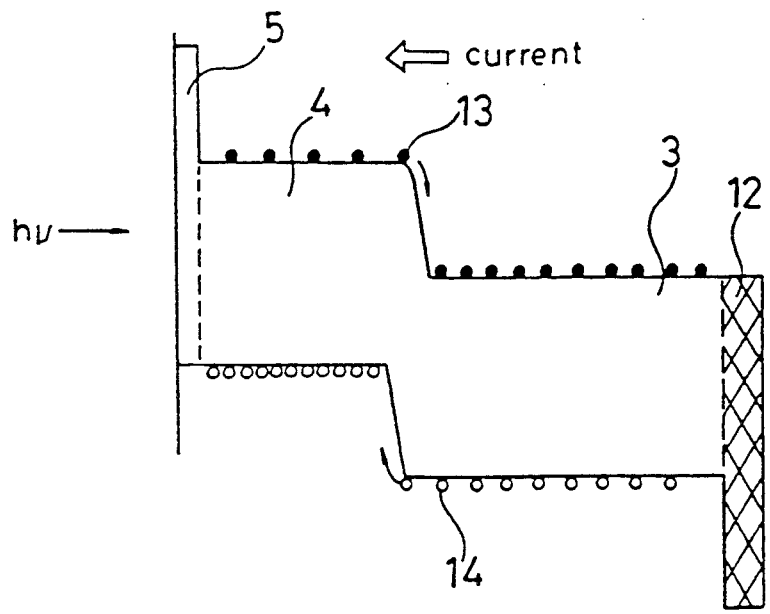
FIG. 5 is an energy band diagram of the cell of FIG. 3.

FIG. 3 shows a cross-sectional view of a GaAs solar cell as a third embodiment of the present invention. FIG. 5 is an energy band diagram of the device of FIG. 3. In the figures, the same reference numerals designate the same elements as those shown in FIG. 1. Reference numeral 12 designates a light reflection layer which produces a BSF effect and which functions as buffer layer 2 with a BSF effect and as the light reflection film 9.

Figure 2:
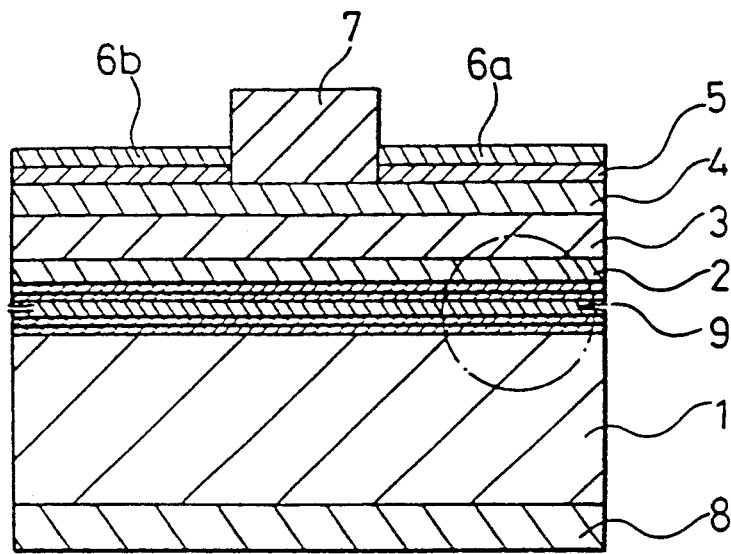
FIG. 2(a) is a cross-sectional view of a GaAs solar cell as a second embodiment of the present invention.
FIG. 2(b) is an enlarged view of a portion of the cell of FIG. 2(a)
Figure 2:
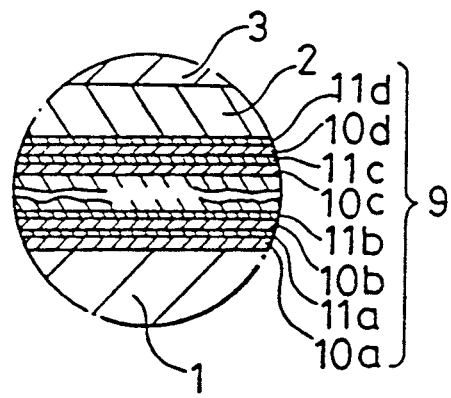

When the material of light reflection layer 9 of FIGS. 1 and 2 is selected such that the energy band gap of the light reflection layer 9 is larger than that of the n type layer 3, the light reflection layer 9 can function as buffer layer 2. As for the light reflection layer 12 with a BSF effect, which functions as light reflection layer 9 and buffer layer 2, $Al_xGa_{1-x}As$ and $GaAs_yP_{1-y}$ are suitable.

If it is supposed that this light reflection layer 12 with a BSF effect is produced in a ¼ wavelength thickness, the reflectance of the light reflection layer 12 can be obtained from formula (1) which shows reflectance at the single-layer film. The higher the difference between (ratio of) the product $n_0 \cdot n_2$ and $n_1$ is, that, the difference between (the ratio of) the product of refractive index of n type layer 3 and n type substrate 1 and the refractive index of the light reflection layer 12 with BSF effect, the higher the reflectance, thereby resulting in increased photocurrent.

Also in this third embodiment, a light generation element superior in radiation resistance and initial efficiency is obtained similarly as in the first and second embodiments.

As is evident from the foregoing description, according to a light generation element of the present invention, a light reflection layer comprising a semiconductor layer is disposed between the semiconductor substrate and the buffer layer, has a larger energy band gap than the photoelectric conversion layer. Alternatively, a light reflection layer which also has a BSF effect is disposed between the semiconductor substrate and the photoelectric conversion layer. Therefore, the quantity of light absorption in the photoelectric conversion layer is increased and thus a light generation element superior in radiation resistance and initial efficiency is obtained.

What is claimed is:

1. A light responsive semiconductor element comprising:
   a second conductivity type semiconductor substrate;
   a buffer layer comprising a second conductivity type semiconductor layer having a first energy band gap;
   a semiconductor light reflection layer having an index of refraction and a thickness disposed on said substrate between said semiconductor substrate and said buffer layer; and
   a photoelectric conversion means comprising a layer of a P type semiconductor having a second energy band gap and a layer of an N type semiconductor having a third energy band gap and forming a PN junction, having a light incident surface and disposed on said semiconductor substrate for producing a photo-current in response to light incident on the incident surface wherein said buffer layer is disposed about one-half the length of the effective light absorption distance of light in the photoelectric conversion means from the light incident surface and the first energy band gap is larger than the second and third energy band gaps.

2. A light responsive semiconductor element comprising:
   a second conductivity type semiconductor substrate;
   a semiconductor light reflection layer having a first energy band gap, an index of refraction, and a thickness disposed on said substrate between said semiconductor substrate and said buffer layer; and
   a photoelectric conversion means comprising a layer of P type semiconductor having a second energy band gap and a layer of an N type semiconductor having a third energy band gap and forming a PN junction, having a light incident surface and disposed on said semiconductor substrate for producing a photocurrent in response to light incident on the incident surface wherein said buffer layer is disposed on about one-half the length of the effective light absorption distance of light in the photoelectric conversion means from the light incident surface and the first energy band gap is larger than the second and third energy band gaps.

3. A light responsive semiconductor element as defined in claim 1 wherein said semiconductor substrate comprises n type GaAs, said photoelectric conversion means comprises a p type GaAs layer and an n type GaAs layer, said buffer layer comprises n type AlGaAs, and said light reflection layer comprises one of $Al_xGa_{1-x}As$ $GaAs_yP_{1-y}$, and $In_xGa_{1-x}As$.

4. A light responsive semi-conductor element is defined in claim 1 wherein said light reflection layer comprises a superlattice including a plurality of first and second films alternating with each other, said first and second reflection films having respective thicknesses, refractive indices, and different reflectances.

5. A light responsive semiconductor element is defined in claim 4 wherein said first reflection films comprise an $Al_xGa_{1-x}As$ series material, and said second reflection films comprise GaAs. wherein said light reflection layer is produced by molecular beam epitaxy.

6. A light responsive semiconductor element as defined in claim 1 wherein the product of the refractive index of said light reflection layer and the thickness of said light reflection layer is equal to a quarter of a wavelength of light which is to be reflected.

7. A light responsive semiconductor element as defined in claim 4 wherein the product of the respective refractive indices and the film thicknesses of the first and second films is equal to a quarter of a wavelength of light which is to be reflected.

8. A light responsive semiconductor element as defined in claim 1 wherein said light reflection layer is produced by metal organic chemical vapor deposition.

9. A light responsive semiconductor element as defined in claim 1 wherein said light reflection layer is produced by molecular beam epitaxy.

10. A light responsive semiconductor element as defined in claim 1 wherein said light reflection layer is produced by vapor phase epitaxy.

11. A light responsive semiconductor element as defined in claim 1 wherein said buffer layer is produced by MOCVD.

12. A light responsive semiconductor element as defined in claim 1, wherein said buffer layer is produced by MBE.

13. A light responsive semiconductor element as defined in claim 1, including a window layer comprising p type $Al_xGa_{1-x}As$ disposed on said photoelectric conversion means and anti-reflection films comprising one of $Si_3N_4$ and $Ta_2O_5$ disposed on said window layer.

14. A light responsive semiconductor element as defined in claim 2 wherein said semiconductor substrate comprises n type GaAs, said photoelectric conversion means comprises a p type GaAs layer and an n type GaAs layer, and said light reflection layer comprises one of $Al_xGa_{1-x}As$ and $GaAs_yP_{1-y}$.

15. A light responsive semiconductor element as defined in claim 2 wherein the product of the refractive index of said light reflection layer and the thickness of said light reflection layer is equal to a quarter of a wavelength of light which is to be reflected.

16. A light responsive semiconductor element as defined in claim 2 wherein said light reflection layer is produced by metal organic chemical vapor deposition.

17. A light responsive semiconductor element as defined in claim 2 wherein said light reflection layer is produced by molecular beam epitaxy.

18. A light responsive semiconductor element as defined in claim 2 wherein said light reflection layer is produced by vapor phase epitaxy.

19. A light responsive semiconductor element as defined in claim 2 including a window layer comprising p type $Al_xGa_{1-x}As$ disposed on said photo-electric conversion means and anti-reflection films comprising one of $Si_3N_4$ and $Ta_2O_5$ disposed on said window layer.

* * * * *

UNITED STATES PATENT AND TRADEMARK OFFICE
CERTIFICATE OF CORRECTION

PATENT NO. : 5,121,183

DATED : June 9, 1992

INVENTOR(S) : Ogasawara et al.

It is certified that error appears in the above-identified patent and that said Letters Patent is hereby corrected as shown below:

Claim 3, column 9, line 50, after "$Ga_{1-x}As$" insert --,--.

Claim 5, column 10, lines 1 and 2, delete "wherein said light reflection layer is produced by molecular beam epitaxy".

Signed and Sealed this

Thirty-first Day of August, 1993

Attest:

BRUCE LEHMAN

*Attesting Officer*   *Commissioner of Patents and Trademarks*